(12) United States Patent
Schwandner et al.

(10) Patent No.: US 8,551,870 B2
(45) Date of Patent: Oct. 8, 2013

(54) METHOD FOR PRODUCING AN EPITAXIALLY COATED SEMICONDUCTOR WAFER

(75) Inventors: Juergen Schwandner, Garching (DE); Roland Koppert, Triftern (DE)

(73) Assignee: Siltronic AG, Munich (DE)

( * ) Notice: Subject to any disclaimer, the term of this patent is extended or adjusted under 35 U.S.C. 154(b) by 279 days.

(21) Appl. No.: 12/797,877

(22) Filed: Jun. 10, 2010

(65) Prior Publication Data

US 2010/0330786 A1      Dec. 30, 2010

(30) Foreign Application Priority Data

Jun. 24, 2009   (DE) .......................... 10 2009 030 296

(51) Int. Cl.
 *H01L 21/20*       (2006.01)
 *H01L 21/304*      (2006.01)

(52) U.S. Cl.
 USPC ............ 438/493; 438/500; 438/507; 438/692

(58) Field of Classification Search
 USPC ............ 438/692, 493, 500, 507; 257/E21.23, 257/E21.09
 See application file for complete search history.

(56) References Cited

U.S. PATENT DOCUMENTS

| | | | |
|---|---|---|---|
| 6,443,807 B1 | 9/2002 | Sakai et al. | |
| 6,602,117 B1 | 8/2003 | Chopra et al. | |
| 8,242,003 B1 * | 8/2012 | Han et al. | 438/493 |
| 2002/0022351 A1 | 2/2002 | Schmolke et al. | |
| 2002/0084000 A1 | 7/2002 | Fitzgerald | |
| 2005/0170749 A1 | 8/2005 | Kann et al. | |
| 2005/0227590 A1 | 10/2005 | Sung | |
| 2007/0197035 A1 | 8/2007 | Morita et al. | |
| 2008/0265375 A1 | 10/2008 | Pietsch et al. | |
| 2009/0029552 A1 | 1/2009 | Schwandner et al. | |
| 2009/0130960 A1 | 5/2009 | Roettger et al. | |

FOREIGN PATENT DOCUMENTS

| | | |
|---|---|---|
| DE | 100 25 871 A1 | 6/2001 |
| DE | 10 2007 019 565 A1 | 9/2008 |
| DE | 10 2007 035 266 A1 | 1/2009 |
| JP | 10012547 A | 1/1998 |
| JP | 2001-135605 A | 5/2001 |
| JP | 2004071833 A | 3/2004 |
| JP | 2007103747 A * | 4/2007 |
| JP | 2007-220974 A | 8/2007 |
| JP | 2009-124153 A | 6/2009 |
| TW | 200525625 | 3/2003 |
| WO | 9213680 A1 | 8/1992 |
| WO | 99/55491 | 11/1999 |

* cited by examiner

*Primary Examiner* — Mary Wilczewski
*Assistant Examiner* — Toniae Thomas
(74) *Attorney, Agent, or Firm* — Brooks Kushman P.C.

(57) ABSTRACT

Epitaxially coated semiconductor wafers are produced by minimally the following steps in the order specified: (a) depositing an epitaxial layer on one side of a semiconductor wafer; (b) first polishing the epitaxially coated side of the semiconductor wafer with a polishing pad with fixed abrasive while supplying a polishing solution which is free of solids; (c) CMP polishing of the epitaxially coated side of the semiconductor wafer with a soft polishing pad which contains no fixed abrasive, while supplying a polishing agent suspension; (d) depositing another epitaxial layer on the previously epitaxially coated and polished side of the semiconductor wafer.

18 Claims, No Drawings

METHOD FOR PRODUCING AN EPITAXIALLY COATED SEMICONDUCTOR WAFER

CROSS-REFERENCE TO RELATED APPLICATIONS

This application claims priority to German Patent Application No. DE 10 2009 030 296.4 filed Jun. 24, 2009 which is herein incorporated by reference.

BACKGROUND OF THE INVENTION

1. Field of the Invention

The invention relates to a method for producing an epitaxially coated semiconductor wafer.

2. Background Art

One extremely important parameter of a semiconductor wafer, on which ever-increasing demands are being placed (cf. ITRS "International Technology Roadmap for Semiconductors"), is its nanotopography. The nanotopography is conventionally expressed as a height variation PV (="peak-to-valley"), based on square measurement windows with an area of 2 mm×2 mm.

In order to study nanotopography, the Nanomapper® instrument from KLA Tencor is suitable, for example this interferometer is suitable for measuring the topography in the range of from −20 nm to +20 nm on the frontside of the semiconductor wafer. During the measurement, the semiconductor wafer is placed on a soft, flat wafer holder (chuck). The resulting peak-to-valley (PV) values are filtered (Gaussian highpass filter) and analyzed on circles with a diameter of 2 mm (also on circles with a diameter of 10 mm) with respect to peak-to-valley deviations. In the THA ("threshold height analysis") analysis (for details see SEMI standard M43), the 3 sigma PV value is ultimately calculated from the distribution of all the PV values as a so called THA value. Often, the THA value is also referred to as THA 2 in order to make it clear that small analysis windows with a diameter of 2 mm have been used.

For electronics, microelectronics and microelectromechanics, semiconductor wafers with extreme requirements for global and local planarity, one side referenced local planarity (nanotopography), roughness and purity are required as starting materials (substrates). Semiconductor wafers are wafers of semiconductor materials, in particular compound semiconductors such as gallium arsenide and mainly elementary semiconductors such as silicon and sometimes germanium. According to the prior art, semiconductor wafers are produced in a multiplicity of successive steps, which can generally be divided into the following groups:
a) producing a monocrystalline semiconductor ingot (crystal growth);
b) cutting the ingot into individual wafers;
c) mechanical processing;
d) chemical processing;
e) chemical mechanical processing;
f) optionally, production of layer structures.

The crystal growth is carried out by pulling and rotating a preoriented monocrystalline seed from a silicon melt, the so-called CZ ("Czochralski") method, or by recrystallization of a vapor-deposited polycrystalline crystal along a melt zone generated by means of an induction coil, which is slowly moved axially through the crystal, i.e. by the so-called FZ ("floating zone") method.

It is known in the prior art of CZ crystal pulling that a growth interface shape characteristic of the respective process parameters is formed in a complex interaction of melt convection or diffusion, dopant segregation at the growth interface and thermal conduction and radiation of the melt and the ingot. The complex material transport phenomena in the melt and during the material deposition at the phase interface lead to a spatially varying concentration of the dopant deposited in the growing semiconductor single crystal.

Owing to the rotational symmetry of the pulling process, pulling device and growing semiconductor ingot, the dopant concentration variations are substantially radially symmetrical. That is to say, concentric rings of varying dopant concentration are formed along the symmetry axis of the semiconductor single crystal. These dopant concentration variations are also referred to as "striations," and can be revealed by measuring the local surface conductivity or structurally as nonplanarity after treatment with a defect etch.

Sawing the semiconductor rod to separate it into individual semiconductor wafers leads to near surface layers of the resulting semiconductor wafers whose monocrystallinity is damaged. These damaged layers are subsequently removed by chemical and chemical mechanical processing.

The material removal rate in chemical or chemical mechanical processing of the surface of a semiconductor wafer depends on the local chemical or electronic properties of the semiconductor surface. Annular nonplanarities are formed in the surface of the silicon wafer, according to the dopant concentration variations. This concentric height modulation of the surface after chemical or chemical mechanical processing is also referred to as "striation."

Semiconductor wafers suitable as a substrate for particularly demanding applications in electronics, microelectronics or microelectromechanics must have a particularly high degree of planarity and homogeneity of their surface. This is because the planarity of the substrate wafer crucially limits the achievable planarities of the individual circuit planes of typical multilayer components, which are subsequently structured on the surface photolithographically. If the starting planarity is insufficient, then breakthroughs of the applied insulation layers will occur later during the various processes of planarizing the individual wiring planes, leading to short circuits and therefore failure of the components thus produced.

For this reason, semiconductor wafers which have small and long wavelength dopant concentration variations as far as possible, are preferred by the prior art. This more desirable dopant concentration variation can be achieved by pulling at particularly slow pull rates, in order to maintain a necessary particularly flat growth interface. Such processes, however, are laborious and uneconomical.

Semiconductor wafers are often provided with an epitaxial layer, i.e. with a layer deposited in monocrystalline form with the same crystal orientation, onto which semiconductor structures are subsequently applied. Such epitaxially coated semiconductor wafers have certain advantages over semiconductor wafers made of homogeneous material, for example the prevention of charge reversal in bipolar CMOS circuits due to short circuit of the component ("latch up" problem), low defect densities (for example a reduced number of COPs ("crystal originated particles")) and the absence of a significant oxygen content, so that the risk of short circuits due to oxygen precipitates can be excluded in regions relevant for the components. However, ring structures on the surface are also observed in epitaxially coated semiconductor wafers. These also lead to a comparatively poor nanotopography (THA 2 value, cf. above).

SUMMARY

It was an object of the invention to avoid striations on epitaxially coated semiconductor wafers and to improve their nanotopography, without having to tolerate the disadvantages of the prior art, for example slow, uneconomical pulling. These and other objects are achieved by a method for producing an epitaxially coated semiconductor wafer, comprising the following steps in the order specified: (a) depositing an epitaxial layer on one side of a semiconductor wafer; (b) a first polishing of the epitaxially coated side of the semiconductor wafer by using a polishing pad with fixed abrasive while supplying a polishing solution which is free of solids; (c) CMP polishing of the epitaxially coated side of the semiconductor wafer by using a soft polishing pad which contains no fixed abrasive, while supplying a polishing agent suspension; and (d) depositing another epitaxial layer on the previously epitaxially coated and polished side of the semiconductor wafer.

DETAILED DESCRIPTION OF THE PREFERRED EMBODIMENTS

The invention therefore starts with a single crystal grown according to the prior art, the wafers cut from the single crystal and processed further having the typical striations described above. The semiconductor wafer is preferably a monocrystalline silicon wafer, preferably having a diameter of 300 mm or more, and more preferably 450 mm.

Preferably, silicon is deposited epitaxially on a monocrystalline silicon wafer both in step (a) and in step (d). This results in a silicon wafer having an epitaxial silicon layer. It is, however, also preferred to deposit heteroepitaxial layers on a silicon wafer. Preferred heteroepitaxial layers include silicon germanium, silicon carbide, and gallium nitride or another III-V semiconductor.

Until the first epitaxial deposition in step (a) of the method, the fabrication process is conventional. In particular, the method is independent of the type of crystal pulling, and in particular independent of whether pulling is carried out quickly or slowly. All the steps until the first epitaxial deposition are carried out conventionally, e.g. according to the prior art. Typical method steps comprise cutting wafers from the pulled single crystal, edge rounding operations, grinding or lapping, etching or cleaning, and polishing (for example DSP and CMP), etc.

A reduced epitaxial layer is preferably deposited in step (a) of the method, i.e. a layer with a layer thickness which is somewhat less than the customary layer thickness of conventional epitaxy (up to 5 µm). The thickness of the deposited layer is more preferably 0.5-4 µm, most preferably 1.5-3.0 µm.

In order to protect the semiconductor wafer from exposure to particles, it is preferably subjected to hydrophilic cleaning before the epitaxial coating. This hydrophilic cleaning generates a native oxide (natural oxide) on the semiconductor wafer, which is very thin (about 0.5-2 nm, depending on the type of cleaning and measurement). The native oxide is removed during pretreatment of the semiconductor wafer in an epitaxy reactor, conventionally in a hydrogen atmosphere (also referred to as an "$H_2$ bake").

In a second step, the surface roughness of the frontside of the semiconductor wafer is conventionally reduced, and polishing defects are removed from the surface by pretreating the silicon wafer with an etchant. Conventionally, gaseous hydrogen chloride (HCl) is used as the etchant and added to the hydrogen atmosphere ("HCl etch").

The semiconductor wafer pretreated in this way subsequently receives an epitaxial layer. In the case of epitaxially coating silicon wafers, to this end, one or more silicon wafers are heated in the epitaxy reactor by means of heat sources, preferably by means of upper and lower heat sources, for example lamps or banks of lamps, and subsequently exposed to a gas mixture consisting of a source gas containing a silicon compound (silane), a carrier gas (for example hydrogen) and optionally a doping gas (for example diborane).

The epitaxial layer is conventionally deposited by the CVD method ("chemical vapor deposition") by silanes, for example trichlorosilane ($SiHCl_3$, TCS), being supplied as a source gas to the surface of the silicon wafer, decomposed there at temperatures of from 600 to 1250° C. into elementary silicon and volatile byproducts, and forming an epitaxially grown silicon layer on the silicon wafer. The epitaxial layer may be undoped or deliberately doped, e.g. with boron, phosphorus, arsenic or antimony by means of suitable doping gases, in order to adjust the conduction type and conductivity.

A susceptor, which consists for example of graphite, silicon carbide (SiC) or quartz and is contained in the deposition chamber of the epitaxy reactor, is used as a support for the silicon wafer during the pretreatment steps and during the epitaxial coating. The silicon wafer conventionally rests in pockets of the susceptor so as to ensure uniform heating and to protect the backside of the silicon wafer, on which a layer is not generally deposited, from the source gas.

According to the prior art, the process chambers of the epitaxy reactors are configured for one or more silicon wafers. For silicon wafers with larger diameters (greater than or equal to 150 mm), it is conventional to use single wafer reactors since these are known for their good epitaxial layer uniformity. The uniformity of the layer thickness can be adjusted by various measures, for example by modifying the gas flow rates (hydrogen, TCS), by incorporating and adjusting gas inlet devices (injectors), by changing the deposition chamber or modifications to the susceptor.

In step (b) of the method, polishing is carried out by means of a polishing pad with fixed abrasive, a polishing agent solution being supplied which is free of solids. Thus, unlike in DSP or CMP, in no case is a polishing agent suspension used which contains abrasive (for example colloidally dispersed silica sol), but instead a preferably alkaline solution without abrasive substances. This step is used to reduce, or even entirely eliminate, the variations on the surface of the semiconductor wafer which are observable after the first epitaxy step. Not all of the deposited epitaxial layer is removed.

After this first polishing, the surface of the semiconductor wafer, or the surface of the remaining epitaxial layer, has certain defects and a certain surface roughness which are caused by processing with the fixed abrasive polishing pad. A polishing pad is used which contains an abrasive substance bound in the polishing pad (FAP or FA pad). Suitable abrasives comprise for example particles of oxides of the elements cerium, aluminum, silicon or zirconium and particles of hard substances such as silicon carbide, boron nitride and diamond.

Particularly suitable polishing pads have a surface topography imparted by replicated microstructures. These microstructures ("posts") have, for example, the shape of columns with a cylindrical or polygonal cross section or the shape of pyramids or pyramid frustums. More detailed descriptions of such polishing pads are contained, for example, in WO 92/13680 A1, US 2005/227590 A1 and in U.S. Pat. No. 6,602,117 B1.

In the simplest case, the polishing agent solution according to step (b) of the method according to the invention is water, preferably deionized water (DIW) with the usual purity for use in the semiconductor industry. The polishing agent solution may however also contain compounds such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH) or any mixtures thereof. The use of potassium carbonate is more particularly preferred.

The proportion of the aforementioned compounds in the polishing agent solution is preferably from 0.01 to 10 wt. %, more preferably from 0.01 to 0.2 wt. %. The pH of the polishing agent solution preferably lies in a range of from 10 to 12.

The polishing agent solution may furthermore contain one or more other additives, for example surface active additives such as wetting agents and surfactants, stabilizers acting as protective colloids, preservatives, biocides, alcohols and sequestrants.

In step (c) of the method conventional CMP polishing is carried out, i.e. polishing with a soft polishing pad while supplying a polishing agent suspension which contains abrasive. The CMP polishing pad used does not contain any fixed abrasive. The polishing agent suspension is preferably alkaline. By this step, the defects on the surface of the semiconductor wafer are eliminated and the surface roughness is reduced.

Preferably, a typical CMP polishing pad is used in step (c), preferably a CMP polishing pad with a porous matrix. The polishing pad preferably consists of a thermoplastic or thermosetting polymer. A multiplicity of substances may be used for the pad material, for example polyurethane, polycarbonate, polyamide, polyacrylate, polyester etc. The polishing pad preferably comprises solid, microporous polyurethane.

It is also preferable to use polishing pads made of foamed plates or felt or fiber substances, which are impregnated with polymers. Coated impregnated polishing pads may also be configured so that there are a different pore distribution and different pore sizes in the substrate than in the coating. The polishing pad may be substantially flat, or perforated. In order to increase the porosity of the polishing pad, fillers may be introduced into the polishing pad.

Commercially available polishing pads are, for example, the SPM 3100 from Rodel Inc. or the pads of the DCP series and the pads of the IC1000™, Polytex™ or SUBA™ brands from Rohm & Hass.

The proportion of the abrasive substance in the polishing agent suspension according to step (c) of the method is preferably from 0.25 to 20 wt. %, more preferably from 0.25 to 1 wt. %. The size distribution of the abrasive particles is preferably monomodal, and the average particle size is from 5 to 300 nm, more preferably from 5 to 50 nm.

The abrasive substance consists of a material which mechanically removes the substrate material, preferably one or more of the oxides of the elements aluminum, cerium or silicon. A polishing agent suspension which contains colloidally dispersed silica (silica sol) is particularly preferred.

The pH of the polishing agent suspension preferably lies in a range of from 9 to 11.5, and it is preferably adjusted by additives such as sodium carbonate ($Na_2CO_3$), potassium carbonate ($K_2CO_3$), sodium hydroxide (NaOH), potassium hydroxide (KOH), ammonium hydroxide ($NH_4OH$), tetramethylammonium hydroxide (TMAH), or any mixtures of these compounds. The use of potassium carbonate is more particularly preferred.

The polishing agent suspension may furthermore contain one or more other additives, for example surface active additives such as wetting agents and surfactants, stabilizers acting as protective colloids, preservatives, biocides, alcohols and sequestrants.

After this step (c), another epitaxial layer is deposited on the semiconductor wafer in order to increase again the layer thickness of the epitaxial layer, which has been reduced by the two preceding polishes.

The total material removal in steps (b) and (c) of the method is preferably 0.5-2.5 µm, but in any event it is smaller than the thickness of the epitaxial layer deposited in step (a) so that, before the second coating in step (d), the semiconductor wafer preferably has an epitaxial layer with a thickness of at least 0.2 µm which is increased again in step (d) of the method. This new deposition of an epitaxial layer is carried out in step (d) of the method. The resulting layer thickness, which is made up of the layer thickness of the epitaxial layer of step (a) remaining after polishing and the layer additionally deposited in step (d), is preferably 0.5-5 µm. This process provides an epitaxially coated semiconductor wafer which has no striations.

Between the first epitaxial deposition and the FAP polishing, and between the CMP polishing and the second epitaxial deposition, conventional cleaning steps are preferably carried out which rid the surface of the semiconductor wafer of any particles. The cleaning steps are preferably of the hydrophilic type, so as to provide a semiconductor wafer having a hydrophilic surface. This corresponds to cleaning steps which are conventional in the semiconductor industry.

The present invention thus claims a two part epitaxy process, at least two polishing steps being carried out between the two epitaxial coating operations.

What is essential for success of the method is the use of a polishing method with a polishing pad that contains fixed abrasive (FAP polishing). While selective material removal is to be observed in conventional CMP, which leads to different polishing removal rates in regions with different dopant concentrations and in practice exposes the striations which subsequently lead to inferior nanotopography during the epitaxial coating, this is avoided by using FAP technology. This is surprising, and thus was not predictable, and leads to clear advantages over conventional methods:

a) improvement of the local geometry and above all the nanotopography, particularly in the short spatial wavelength range (THA 2) for epitaxially coated semiconductor wafers b) optimization of the nanotopography, particularly in the short wavelength range (THA 2), irrespective of the type of crucible pulling process (slow, fast, very fast or different dopant concentrations)

c) production of epitaxially coated semiconductor wafers with particular profiles of the dopant variations, but which do not appear as "striations" on the surface.

d) production of very special epitaxially coated semiconductor wafers having special intrinsic properties with comparable and optimized planarity parameters (nanotopography).

EXAMPLE

The tests were carried out on a polishing machine of the "nHance 6EG" type from Strasbaugh Inc. The polishing machine from Strasbaugh Inc. has a polishing plate with a polishing pad and a polishing head, which processes a semiconductor wafer fully automatically. The polishing head is universally mounted and comprises a fixed baseplate which is covered with a "backing pad," and a mobile retainer ring. Air cushions, on which the semiconductor wafer floats during the polishing, can be set up through holes in the base plate in two concentric pressure zones: an inner pressure zone and an outer pressure zone. The mobile retainer ring can be pressurized by means of a compressed bladder so as to prestress the polishing pad upon contact with the semiconductor wafer, and keep it flat.

A plurality of epitaxially coated silicon wafers, each with an epitaxial layer thickness of about 2.75 μm, were processed. All these wafers with a diameter of 300 mm had "striations" on their surface. With the aid of sampling, three wafers with representative polishing settings were observed and evaluated. The range for the polishing removal varied in an interval of from about 0.9 μm to about 2.05 μm, which means that there was a residual epi layer thickness of at least 0.7 μm for each setting observed.

As the FA polishing pad, a polishing pad with frustopyramidal cerium oxide microreplicates and a particle size of 0.5 μm was used. More detailed descriptions of such polishing pads may be found, for example, in U.S. Pat. No. 6,602,117 B1. After the first FA polishing step, two further polishing steps were carried out on the same FA polishing pad using silica sol (Glanzox 3900; 1 wt. %) in order to smooth the surface. Glanzox 3900 is the product name of the polishing agent suspension which is provided as a concentrate by Fujimi Incorporated, Japan. The undiluted solution has a pH of 10.5 and contains about 9 wt. % of colloidal $SiO_2$ with an average particle size of from 30 to 40 nm.

After these two additional FAP polishes while supplying a polishing agent suspension, the wafers were already free of striations. A subsequent CMP step to achieve a defect free surface was used to remove existing defects (LLS, micro scratches) and ensure defect free silicon growth.

For the two smoothing polishing steps using silica sol (Glanzox 3900; 1 wt. %), the following settings were employed:

Smoothing Step 1:

duration=240 sec silica sol volume flow rate=350 ml min head plate rotation speed ratio=23 rpm:43 rpm retainer ring application pressure (floating retainer ring)=2 psi pressure in pressure zones of the carrier=2 psi in the inner pressure zone, 2 psi in the outer pressure zone (for the two concentric pressure zones, inner & outer)

polishing pressure=4 psi.

Smoothing Step 2:

duration=60 sec silica sol volume flow rate=350 ml min head plate rotation speed ratio=23 rpm:24 rpm retainer ring application pressure (floating retainer ring)=2 psi pressure in pressure zones of the carrier=2 psi in the inner pressure zone, 2 psi in the outer pressure zone polishing pressure=0.5 psi In the FAP polishing according to step (b) of the method, the following settings were selected for the three successful wafers:

As the polishing agent solution, 0.2 wt. % $K_2CO_3$ solution was used in each case.

Example A duration=485 sec volume flow rate of $K_2CO_3$ solution (0.2 wt. %)=1500 ml min head plate rotation speed ratio=23 rpm:43 rpm retainer ring application pressure (floating retainer ring)=2 psi pressure in pressure zones of the carrier=2 psi in the inner pressure zone, 2 psi in the outer pressure zone polishing pressure=4 psi.

Example B duration=242 sec volume flow rate of $K_2CO_3$ solution (0.2 wt. %)=1500 ml min head plate rotation speed ratio=23 rpm:43 rpm retainer ring application pressure (floating retainer ring)=2 psi pressure in pressure zones of the carrier=2 psi in the inner pressure zone, 2 psi in the outer pressure zone polishing pressure=4 psi.

Example C duration=120 sec volume flow rate of $K2CO3$ solution (0.2 wt. %)=1500 ml min head plate rotation speed ratio=23 rpm:43 rpm retainer ring application pressure (floating retainer ring)=2 psi pressure in pressure zones of the carrier=2 psi in the inner pressure zone, 2 psi in the outer pressure zone polishing pressure=4 psi.

After the polishes, epitaxial layers were again deposited. The layer thicknesses lay in the range of from 2.5 to 2.75 μm. All three wafers no longer had striations after the second epitaxial coating in step (d).

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing an epitaxially coated semiconductor wafer by providing a semiconductor wafer having no epitaxial layer deposited thereon, and providing an epitaxial layer by a method, comprising the following steps in the order specified: (a) depositing an epitaxial layer on one side of a semiconductor wafer; (b) first polishing of the epitaxially coated side of the semiconductor wafer by using a polishing pad with fixed abrasive while supplying a polishing solution which is free of solids;(c) CMP polishing of the epitaxially coated side of the semiconductor wafer with a soft polishing pad containing no fixed abrasive, while supplying a polishing agent suspension; (d) depositing another epitaxial layer on the previously epitaxially coated and polished side of the semiconductor wafer, wherein in step (b) not all of the epitaxial layer of step (a) is removed by the first polishing.

2. The method of claim 1, wherein the thickness of the layer deposited in step (a) is 0.5-4 μm.

3. The method of claim 1, wherein the polishing pad used in step (b) contains fixed abrasive comprising particles of oxides of the elements cerium, aluminum, silicon and zirconium or particles selected from the group of hard substances consisting of silicon carbide, boron nitride and diamond, or mixtures of particles of oxides and hard substances.

4. The method of claim 2, wherein the polishing pad used in step (b) contains fixed abrasive comprising particles of oxides of the elements cerium, aluminum, silicon and zirconium or particles selected from the group of hard substances consisting of silicon carbide, boron nitride and diamond, or mixtures of particles of oxides and hard substances.

5. The method of claim 1, wherein the polishing solution used in step (b) contains compounds sodium carbonate ($Na_2CO_3$), potassium carbonate ($K_2CO_3$), sodium hydroxide (NaOH), potassium hydroxide (KOH), ammonium hydroxide ($NH_4OH$) and tetramethylammonium hydroxide (TMAH) or any mixtures thereof.

6. The method of claim 1, wherein the pH of the polishing solution in step (b) is from 10 to 12.

7. The method of claim 1, wherein the polishing agent suspension of step (c) contains abrasive substances comprising one or more of the oxides of the elements, aluminum, cerium or silicon.

8. The method of claim 1, wherein the polishing agent suspension contains silicon oxide and is a colloidally dispersed silica sol.

9. The method of claim 1, wherein the total material removal in steps (b) and (c) is 0.5-2.5 µm and the semiconductor wafer has an epitaxial layer with a thickness of at least 0.2 µm before the epitaxial layer depositing in step (d).

10. The method of claim 1, wherein the semiconductor wafer has a thickness of 0.5-5 µm after the second epitaxial coating according to step (d).

11. The method of claim 1, wherein the semiconductor wafer is a silicon wafer with a diameter of ≥300 mm.

12. The method of claim 1, wherein the semiconductor wafer is a 450 mm wafer.

13. The method of claim 1, wherein the first polishing of step (b) comprises a polishing with a polishing pad containing fixed abrasive and a polishing solution containing no solids, and a polishing with a polishing pad containing fixed abrasive and a polishing suspension containing abrasive solids.

14. A method for producing an epitaxially coated semiconductor wafer, comprising the following steps in the order specified: (a) providing a semiconductor wafer having a first uniform epitaxial layer deposited thereon; (b) first polishing the first uniform epitaxial layer with a polishing pad with fixed abrasive while supplying a polishing solution which is free of solids; (c) CMP polishing of the first uniform epitaxial layer with a soft polishing pad containing no fixed abrasive, while supplying a polishing agent suspension; depositing a further uniform epitaxial layer onto the first uniform epitaxial layer, wherein in step (b), not all of the first uniform epitaxial layer is removed by the first polishing.

15. The method of claim 14, wherein the first uniform epitaxial layer has an initial thickness of from 0.5-4 µm, and following step (c) has a remaining thickness of at least 0.2 µm.

16. The method of claim 15, wherein the total thickness of the epitaxial layer formed from the remaining thickness of the first uniform epitaxial layer and the thickness of the further epitaxial layer is from 0.5 µm to 5 µm.

17. The method of claim 1, wherein the epitaxially coated wafer following step (d) is free of striations caused by radical variation of dopant.

18. The method of claim 14, wherein the epitaxially coated wafer following step (d) is free of striations caused by radical variation of dopant.

* * * * *